United States Patent [19]
Walker et al.

[11] Patent Number: 5,895,950
[45] Date of Patent: Apr. 20, 1999

[54] SEMICONDUCTOR DEVICE HAVING A NON-VOLATILE MEMORY AND METHOD OF MANUFACTURING SUCH A SEMICONDUCTOR DEVICE

[75] Inventors: Andrew J. Walker; Roger Cuppens, both of Eindhoven; Alwin N. Krönert, Dordrecht, all of Netherlands

[73] Assignee: U.S. Philips Corporation, New York, N.Y.

[21] Appl. No.: 08/838,247

[22] Filed: Apr. 17, 1997

Related U.S. Application Data

[63] Continuation of application No. 08/301,443, Sep. 6, 1994, abandoned.

[30] Foreign Application Priority Data

Sep. 6, 1993 [BE] Belgium .............................. 09300912

[51] Int. Cl.[6] .................................................. H01L 29/788
[52] U.S. Cl. ..................... 257/315; 257/316; 365/185.01; 365/185.26
[58] Field of Search ..................... 257/315, 316, 257/264, 910, 318; 365/185, 185.01, 185.28, 185.26, 185.33; 395/500; 437/43

[56] References Cited

U.S. PATENT DOCUMENTS

| | | | |
|---|---|---|---|
| 3,868,187 | 2/1975 | Masuoka | 357/23 |
| 4,295,265 | 10/1981 | Horiuchi et al. | 257/316 |
| 4,434,433 | 2/1984 | Nishizawa | 257/264 |
| 4,491,859 | 1/1985 | Hijiya et al. | 257/318 |
| 4,503,524 | 3/1985 | McElroy | 365/218 |
| 4,698,787 | 10/1987 | Mukherjee | 365/185 |
| 4,766,088 | 8/1988 | Kono et al. | 437/52 |
| 4,958,321 | 9/1990 | Chang | 365/185.28 |
| 5,311,049 | 5/1994 | Tsuruta | 257/324 |
| 5,337,274 | 8/1994 | Ohji | 257/315 |
| 5,371,027 | 12/1994 | Walker | 437/43 |
| 5,426,769 | 6/1995 | Pawloski | 395/500 |
| 5,445,987 | 8/1995 | Kuroda et al. | 257/316 |
| 5,455,793 | 10/1995 | Amin et al. | 257/315 |
| 5,457,652 | 10/1995 | Brahmbhatt | 257/315 |
| 5,467,305 | 11/1995 | Bertin | 365/185.01 |

FOREIGN PATENT DOCUMENTS

| | | | |
|---|---|---|---|
| 0446893 | 3/1990 | European Pat. Off. . | |
| 5347418 | 12/1993 | Japan | 257/315 |
| 06-5872 | 1/1994 | Japan | 257/315 |

OTHER PUBLICATIONS

Hsu et al, "A High Speed, Low Power P–Channel Flash EEPROM using Silicon Rich Oxide as Tunneling, Dielectri", Solid State Devices and Materials, Tsukuba, 1992, pp. 140–142.

Haddad et al "An Investigation of Erase–Mode Dependent Hole Trapping in Flash EEPROM Memory, Cell", IEEE Electron Device Letters, vol. 11 No. 11, Nov. 1990, pp. 514–516.

*Primary Examiner*—Olik Chaudhuri
*Assistant Examiner*—Phat X. Cao
*Attorney, Agent, or Firm*—Brian J. Wieghaus

[57] ABSTRACT

The invention relates to a non-volatile memory with floating gate, in particular a Flash-EPROM, in which writing takes place through injection of hot electrons into the floating gate and in which erasing takes place through injection of hot holes. To keep the write and erase voltages sufficiently low, p-type zones which locally increase the background doping concentration of the p-type substrate are provided around the n-type source and drain zones. These p-type zones cause an increased field strength at the drain zone whereby hot electrons are formed at the pinch-off point also at lower voltages. This increased background concentration in addition reduces the breakdown voltage of the pn junction of the source and drain zones, so that hot holes for erasing can be formed by pn breakdown at comparatively low voltages. The device is particularly suitable for being integrated into a signal processing IC manufactured in a standard process, such as a microcontroller.

10 Claims, 3 Drawing Sheets

SEMICONDUCTOR DEVICE HAVING A NON-VOLATILE MEMORY AND METHOD OF MANUFACTURING SUCH A SEMICONDUCTOR DEVICE

This is a continuation of application Ser. No. 08/301,443, filed on Sep. 6, 1994, now abandoned.

BACKGROUND OF THE INVENTION

The invention relates to a semiconductor device with a semiconductor body which is provided at a surface with a non-volatile electrically erasable memory comprising a number of memory elements with source and drain zones situated in a p-type surface region of the semiconductor body, adjoining the surface, and mutually separated by an interposed channel region, with a floating gate situated above the channel region and insulated therefrom by an interposed gate dielectric, and with a control gate insulated from the floating gate, information being written and erased through injection of hot electrons and hot holes into the floating gate, while the hot electrons are generated in the channel adjacent the drain zone through induction of a channel current between the source zone and drain zone. The invention also relates to a method of manufacturing this semiconductor device.

Such a device is known, for example, from European Patent Application EP-A 0 218 342, publication date 15.04.87.

Non-volatile memories with floating gates are known in the literature, for example, under the abbreviations EPROM and EEPROM (Electrically Erasable Programmable Read-Only Memory). An embodiment which is particularly popular at the moment is known under the name Flash-EEPROM or Flash-EPROM, with which a very high density can be obtained because each memory cell is formed by a single floating-gate transistor. The selection transistors, which are necessary for each memory element in an EEPROM of a usual type, are absent in the memory.

In the known device mentioned above, the transistor selected for writing is brought into the "ON state" by means of a high voltage applied to the control gate and the drain zone. Owing to the strong electric field near the drain zone, high-energy (hot) electrons are formed in the channel current with sufficient energy for flowing across the potential barrier of the gate dielectric to the floating gate, partly also under the influence of the electric field in the gate dielectric. Erasing of the information takes place in the known device through injection of hot holes which compensate the charge injected during writing.

This method differs from the usual method of erasing whereby electrons tunnel from the floating gate to a zone in the semiconductor body, for example, the source zone. A very thin dielectric is necessary in view of the tunnelling effect, which implies an added complication for the manufacturing process of the device, especially when the memory is embedded in a signal-processing IC, for example, a microcontroller which is manufactured by a different process. Such a thin tunnel oxide is unnecessary when erasion takes place with hot holes. The hot holes are formed by a "snap-back" method in which a comparatively high voltage is applied between the source zone (earth) and the drain zone (7 V), while the transistor is in the "OFF state". The control gate is then brought to a high voltage (13 V) for a short period whereby the transistor enters the "ON state", after which the voltage at the control gate is reduced to 0 V. Since the pn junction of the source zone remains forward-biased, an electron current is injected into the substrate so that a comparatively high drain current is maintained owing to lateral npn operation in spite of the low voltage at the control gate. Thanks to the low voltage at the control gate, hot holes formed by the strong field can be injected into the floating gate.

A disadvantage of the known device is that the "snap-back" mechanism described here is highly critical. Thus, the optimum voltage at the drain zone, which must be sufficient for obtaining the snap-back effect but must be lower than the breakdown voltage between the source and drain zone (punch-through voltage), strongly depends on doping concentrations and dimensions. Owing to the spread in such parameters, it is often difficult in practice to choose for the device such an adjustment that all cells can be erased in the manner described above.

During writing, a high voltage is applied to the selected word line in order to render the transistor in the selected cell conducting. Owing to capacitive coupling, the floating gates of the other cells connected to this word line may get a higher potential. It is possible then for electrons to flow towards the floating gates of these quasi-selected cells owing to the tunnelling effect. This phenomenon, which is known as "gate disturb", was described inter alia in the publication "Degradations due to hole trapping in flash memory cells" by Haddad et al. in IEEE Electron Device Letters, vol. 10, no. 3 March 1989, pp. 117–119. As is indicated in this publication, the "gate disturb" effect is reinforced by holes which are trapped in the gate dielectric. In a selected cell, moreover, it is found that writing becomes more difficult after a number of write/erase cycles in the sense that the difference between the threshold voltage in the programmed state and the threshold voltage in the non-programmed state becomes smaller. A possible explanation for this is that the electric field in the channel is weakened by the trapped holes in the gate oxide. Since the tunnelling effect is also strongly influenced by the electric field across the gate oxide, it is important to keep the programming voltage as low as possible, especially in memories in which erasing takes place with hot holes. Moreover, high voltages in general impose additional requirements, for example, on the dielectric insulation, parasitic channel formation, etc, which seriously hamper the embedding of the memory in an integrated circuit manufactured by a standard CMOS logic process. This also renders it desirable to keep the programming voltages and erasing voltages as low as possible.

SUMMARY OF THE INVENTION

The invention has for its object inter alia to provide a non-volatile memory in which information on the floating gate can be erased in a reproducible and reliable manner by means of hot holes. Another object of the invention is to give the memory cell such a construction that hot charge carriers of either polarity can be formed at comparatively low voltages. The invention further has for its object to provide such a non-volatile memory which can be embedded in, for example, a microcontroller manufactured by a standard IC process substantially without changes in the process.

According to the invention, a semiconductor device of the kind described in the opening paragraph is characterized in that the source zone and the drain zone within the semiconductor body are surrounded by a p-type zone of a higher doping concentration than the p-type surface region, and in that the hot holes are generated through avalanche breakdown of one of the pn junctions between the n-type source or drain zone and the p-type surface region. Avalanche breakdown of the pn-junction of the reverse biased source or drain zone for the formation of the hot holes is a simple, non-critical and reproducible manner of forming hot holes for erasion. By choosing a suitable doping concentration for the p-type zone adjoining the source or drain zone, it is possible to adjust the breakdown voltage to a comparatively low value, for example, between 5 and 6 V. Such a voltage requires no additional measures which would render modifications in a standard CMOS process necessary. This voltage, moreover, can usually be readily generated on the chip itself. The presence of a comparatively highly doped p-type zone around the drain zone also strengthens the field at the drain zone whereby it is also possible to write at comparatively low voltages on the word line, for example 8 V, and on the drain zone. Owing to the symmetrical construction of the cell, the memory is particularly suitable for being embedded in an integrated circuit for signal processing.

An important embodiment of a semiconductor device according to the invention is characterized in that the gate dielectric has a thickness over its entire surface such that injection of charge carriers into the floating gate caused by the tunnelling effect is completely or at least substantially completely prevented at the applied voltages. Since the thickness of the gate dielectric is greater here than when the tunnelling effect is used, the electric fields across the gate dielectric are considerably weaker, whereby the "gate disturb" effect described above is reduced. It is in addition possible to choose the same thickness and composition for the gate dielectric in the memory cell as in the MOS transistor in the logic portion of the circuit. A gate dielectric may be advantageously used which comprises a silicon oxide layer with a thickness of at least 10 nm, and preferably a thickness of at least approximately 15 nm.

The invention also relates to a method of manufacturing a semiconductor device comprising a non-volatile memory as described here before whereby besides the memory further circuit elements are provided in the semiconductor body, comprising at least a field effect transistor with an insulated gate electrode which is formed in an active region situated outside the memory, while the surface of the semiconductor body is covered with an insulating layer at least at the area of the memory elements and of the active region for the purpose of forming the memory elements and the transistor, which insulating layer forms a gate dielectric on which a silicon layer is provided from which the gate electrode of the transistor and at least the floating gates of the memory elements are formed. According to a further aspect of the invention, such a method is characterized in that, in a first series of process steps, the floating gates of the memory elements are first formed from the silicon layer through masked etching while the active region of the transistor remains covered by the silicon layer, after which the n-type source and drain zones of the memory elements and the p-type zones surrounding these source and drain zones in the semiconductor body are provided and the floating gates are each provided with an oxide layer or spacer at least at their edges by means of an oxidation step, and in that, in a subsequent series of steps, the insulated gate electrode of the transistor is formed from the silicon layer above the active region by masked etching and source and drain zones of the transistor are provided in the active region through doping. An important preferred embodiment is characterized in that the transistor is provided with a gate dielectric of a thickness and composition which are equal or at least substantially equal to the thickness and composition of the gate dielectric in the memory elements.

BRIEF DESCRIPTION OF THE DRAWING

The invention will be explained in more detail with reference to an embodiment and the accompanying diagrammatic drawing in which.

DETAILED DESCRIPTION OF THE PREFERRED EMBODIMENTS

Figure 1:
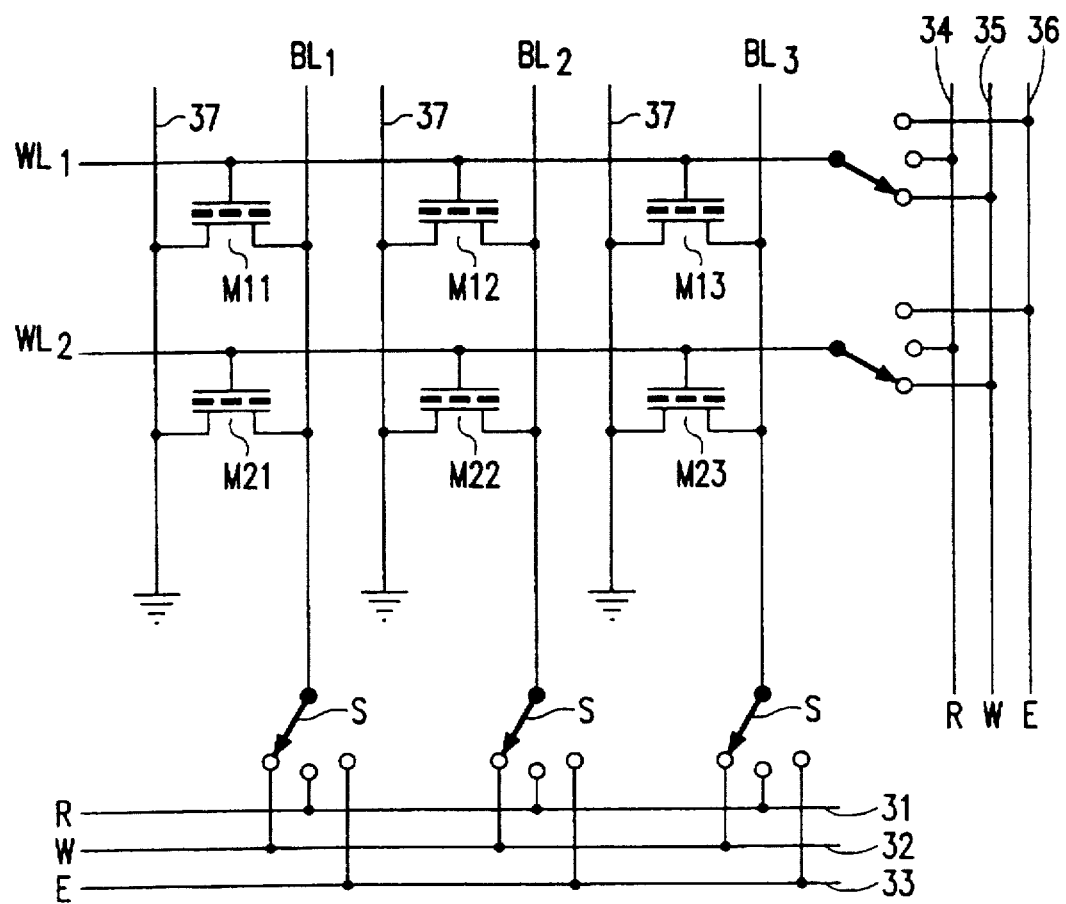
FIG. 1 is a circuit diagram of a non-volatile memory according to the invention.
Figure 2:
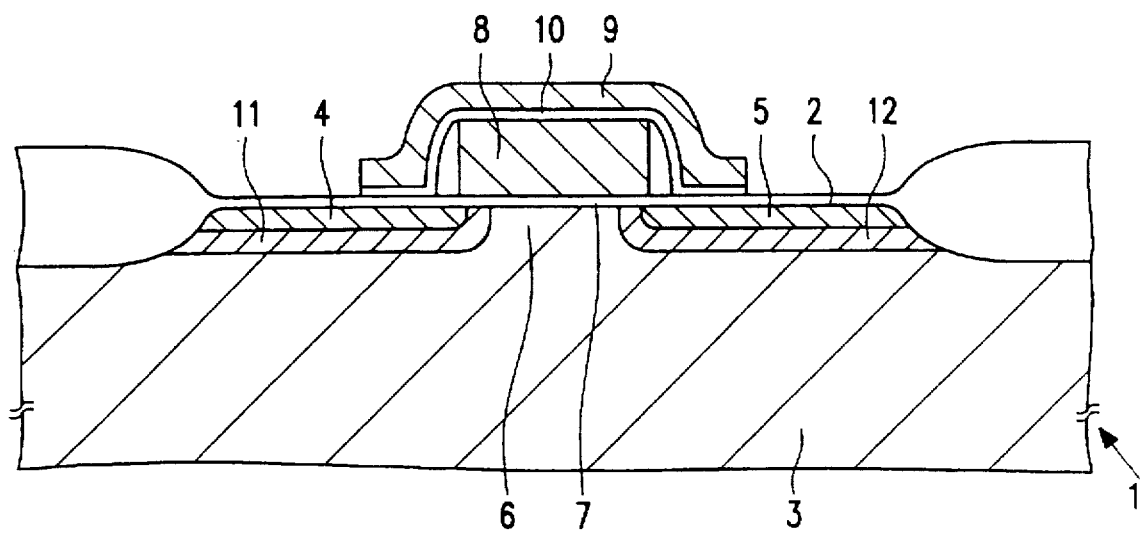
FIG. 2 is a cross-section of a cell of this memory.

The embodiment according to FIGS. 1 and 2 comprises a silicon semiconductor body 1 with a p-type surface region 3 adjoining the surface 2. This region may cover the entire semiconductor body, but it may alternatively form only a portion of the semiconductor body and consist of, for example, a p-type diffused or implanted zone or well in an n-type semiconductor body. The memory, built up from cells of which a single one is depicted in cross-section in FIG. 1, is provided at the surface 2 in rows and columns. FIG. 1 shows two rows, coupled to the word lines $WL_1$ and $WL_2$ and three columns coupled to the bit lines $BL_1$, $BL_2$ and $BL_3$, with six cells in total. In practice, the number of word lines and bit lines will obviously be much greater.

The memory cells or memory elements are constructed as MOS transistors with floating gates and each comprise an n-type source zone 4 and drain zone 5 adjoining the surface, provided in the p-type region 3, and mutually separated by an interposed channel region 6. The floating gate 8 is located above the channel region and is electrically insulated therefrom by a gate dielectric 7. A control gate 9 connected to a word line WL is provided above the floating gate 8 and electrically insulated therefrom. The insulation between the gates 8 and 9 is formed by a dielectric layer 10 which comprises, for example, a layer of oxynitride, but which may alternatively comprise a layer of silicon nitride between two layers of silicon oxide.

For writing a selected cell, a positive voltage is applied to the associated word line and bit line, whereby the transistor is made conducting. The channel length and the voltages are such that, as is usual in Flash EPROM, hot electrons are formed in the channel at the pinch-off point near the drain 5, which electrons flow towards the floating gate 8 across the potential barrier of the gate dielectric 7 under the influence of a field induced through the word line. For erasing, hot holes are used which are also formed in the semiconductor body and which have sufficient energy for flowing through the gate dielectric to the floating gate 8.

According to the invention, the source zone 4 and the drain zone 5 are surrounded by a p-type zone 11 and a p-type zone 12, respectively, within the semiconductor body, which zones have a higher doping concentration than the p-type surface region 3. The hot holes required for erasing are generated by avalanche breakdown of at least one of the pn junctions of the source and drain zones. Since the tunnelling effect is not used, neither for writing nor for erasing, it is possible to use an insulating layer for the gate dielectric 7 with a thickness and composition usual for a conventional MOS transistor, for example, a silicon oxide layer with a thickness of at least 10 nm. In the present example, the gate dielectric is formed by a silicon oxide layer with a thickness of approximately 15 nm. The breakdown voltage of the relevant pn junction is considerably reduced by the higher concentration in the zone 11 or 12, at least to a much lower level than if the pn junction were formed immediately between the n-type source or drain zone and the comparatively weakly doped p-type region 3. Experiments have shown that the additional p-type doping can achieve a breakdown voltage of approximately 6 V, whereas without this doping breakdown voltage would be approximately 12 V given a doping concentration of the p-type region 3 which is usual in CMOS processes. Since the p-type zone 12 extends into the channel, strong fields are obtained in the channel near the pinch-off point, so that no excessively high voltage is required on the word line and drain zone during writing for generating hot electrons. For an embedded memory, in which in general no extremely high writing speed is required, a write voltage of 5 V on the drain zone and a voltage of 8 V on the word line are favourable values for a channel length of 0.8 µm. Owing to the comparatively low voltages during writing and the comparatively great thicknes of the gate dielectric 7, the electric fields across the gate dielectric during writing are substantially weaker than in corresponding known memories, which is favourable in view of the said gate disturb effect.

To clarify the operation of the memory, FIG. 1 diagrammatically shows the read (R), write (W) and erase (E) states into which the bit lines BL can be brought by the switches S on the lines 31, 32 and 33, respectively. In an analogous manner, the lines 34, 35 and 36 show the read, write and erase states into which the word lines WL can be brought by means of the switches S. The source zones of the cells in this example are connected to earth or some other suitable reference voltage via the connection lines 37. The operation of the device is explained in more detail with reference to the following Table, it being assumed that cell $M_{11}$ is to be selectively read and written, while erasation takes place for all cells simultaneously.

TABLE 1

|  | $WL_1$ | $WL_j$ | $BL_1$ | $BL_j$ |
|---|---|---|---|---|
| read | 3 | 0 | 1.0 | 0 |
| write | 8 | 0 | 4.5 | 0 |
| erase | −9 | −9 | 5.7 | 5.7 |

Read; Depending on the presence or absence of negative charge, the threshold voltage of the transistor is high, for example 6 V, or low, for example approximately 1 V. It is determined whether the transistor becomes conducting or not in that a voltage of, for example, 3 V is applied to the selected word line $WL_1$, and a voltage which is chosen to be as low as possible, for example 1.0 V, is applied to $BL_1$. A voltage of 0 V may be applied to the other word and bit lines, so that the other transistors are not conducting.

Write: It is assumed that no charge is present on the floating gate of cell $M_{11}$. A voltage of 8 V is applied to word line $WL_1$ and a somewhat lower voltage, for example 4.5 V, is applied to the bit line $BL_1$. The other bit lines may be connected to earth, according to the Table, but they may alternatively be brought to a floating potential. Since the gate voltage is higher than the threshold voltage, transistor $M_{11}$ becomes conducting. An electric field arises in the channel at the area of the pinch-off point, which field is so strong that the electrons in the channel receive sufficient energy for flowing across the potential barrier of the gate oxide 7 to the floating gate 8. The more strongly doped p-type zone 12 achieves that the major portion of the voltage between source and drain zone is applied across the portion of the channel defined by the zone 12, so that the field will be very strong. Generation of hot electrons is also possible as a result of this at substantially lower gate voltages than in the known device described above. Owing to the comparatively low gate voltage and the comparatively thick gate oxide 7, the electric fields across the gate oxide 7 in the other cells of the same word line $WL_1$ are so weak that charge transfer to the floating gate by tunnelling can be kept sufficiently low. It was found in experiments that the threshold voltage had been raised to approximately 6 V after approximately 0.01 ms of writing, which is an acceptable time for an embedded memory. Shorter writing times are obviously also possible, for example, in that a slightly higher voltage is applied to the drain zone.

Erase; Erasing may be carried out in the "flash" mode, whereby an entire memory block or even the entire memory is erased in that the word lines WL and the bit lines BL are connected to the erase lines 36 and 33, respectively, through the switches S. A voltage of, for example, 5.7 V is applied to the bit lines and a voltage of, for example, −9 V to the word lines and the control gates connected thereto. The values of these voltages may be adjusted within certain limits, for example, in view of the erasing speed. The p-type region 3 is assumed to be connected to earth. Avalanche breakdown takes place at the blocked pn junction of the drain zones, so that hot holes are generated which can flow to the floating gate, owing to the low voltage at the control gate, and compensate the negative charge stored on this floating gate. Experiments have shown that the threshold voltage in a programmed cell with high threshold voltage initially falls steeply as a function of time and that this fall takes place more slowly in proportion as the threshold voltage approaches the original value (approximately 1 V) more closely. As a result of this, the cell can be readily returned to the original state with only a small risk that the cell is changed into a transistor of the depletion type owing to over-erasure.

Figure 3:
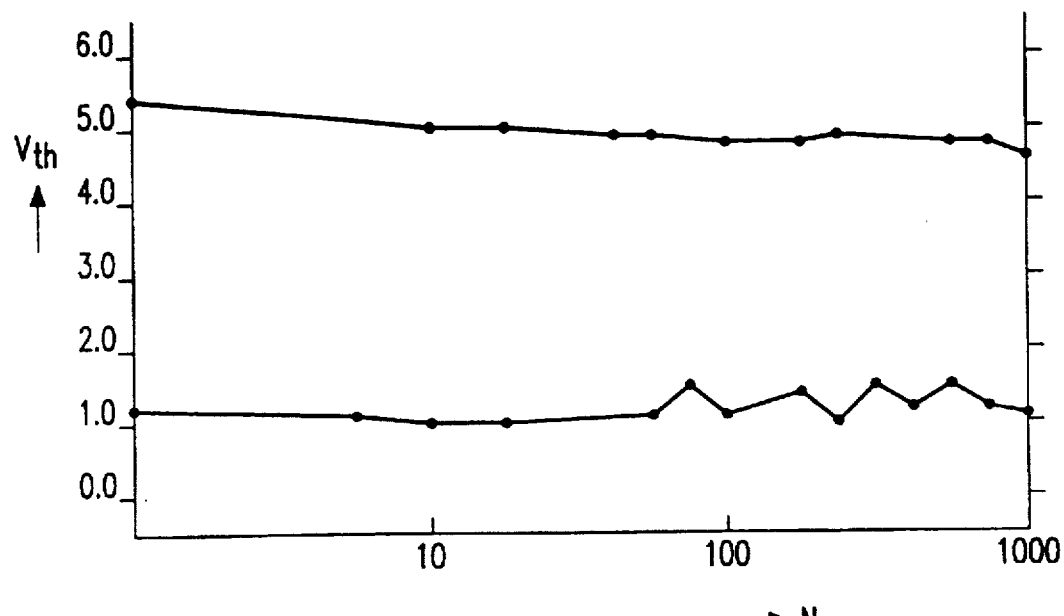
FIG. 3 shows the gradient of the threshold voltage as a function of the number of write/erase cycles N.

During erasing, holes may be trapped by the gate oxide 7 which renders the injection of electrons into the floating gate of the selected cell more difficult, probably owing to weakening of the electric fields, as described in the cited article by Haddad et al. FIG. 3 shows this degradation for a cell after 1000 times erasing and writing. The threshold voltage $V_{th}$ is plotted on the vertical axis and the number of write/erase cycles on the horizontal axis. The upper line gives the threshold voltage of the cell programmed in the manner described here; the lower line gives the threshold voltage of the cell after it has been erased with hot holes. It is found that the threshold voltage of the programmed cell does become somewhat lower gradually, so that the difference between the two states is reduced, but that this difference nevertheless has remained so great after 1000 times writing and erasing that the cell has remained functional. For a memory embedded in, for example, a microcontroller, this number of write/erase cycles is usually amply sufficient.

For the manufacture of the device, the reader is referred to the previously filed European Patent Application no. 92203082.0 by Applicant, the contents of which are deemed to be included in the present application by reference, and in which a standard CMOS process is described, supplemented with a few specific steps for optimizing the embedded non-volatile memory without degradation of the logic portions of the integrated circuit. Since the cell described in the earlier Application does not comprise the p-type zones 11 and 12, a few important process steps will be described here. In FIGS. 4–8, the Figs. with suffix a correspond to the logic portion of the circuit, in this case represented by a usual transistor provided in an active region situated outside the region of the memory matrix. The Figs. with suffix b correspond to the non-volatile memory.

Figure 4A:
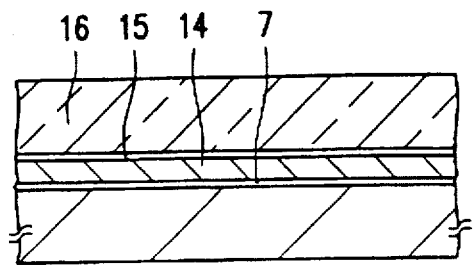
FIGS. 4a, 4b, 5a, 5b, 6a, 6b, 7a, 7b, 8a, 8b, show a few stages in the manufacture of an integrated circuit comprising such a memory.
Figure 4B:
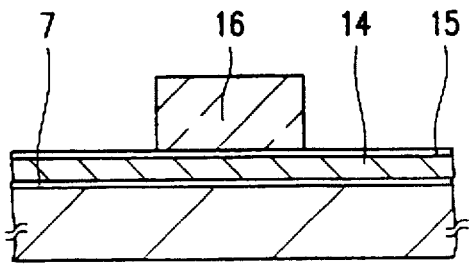
Figure 5A:
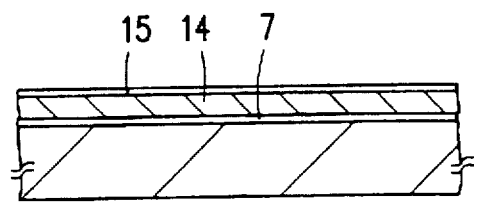
Figure 5B:
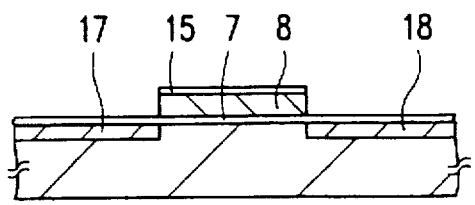

FIG. 4 shows the stage in which the surface of the active regions in both the memory portion and the logic portion of the integrated circuit is covered with a 15 nm thick oxide layer 7 which forms the gate oxide after the field oxide (not shown) and n-type or p-type surface regions or wells have been provided. On this layer 7 is provided a first silicon layer 14 of polycrystalline composition, referred to as poly for short hereinafter, which is doped with a suitable impurity, for example, As. The thickness of the layer 14 is approximately 150 nm. A nitride or oxynitride layer 15 which masks against oxidation is provided thereon. An etching mask with a photoresist layer 16 is provided in usual manner, which defines the floating gates to be formed in the memory and which entirely covers the logic portion. The exposed portion of the layer 15 is then removed in a manner known per se, after which the floating gates 8 are formed from the poly layer 14 by etching. The photoresist layer 16 is removed, after which a boron implantation is carried out in a self-aligned manner relative to the gate 8 so as to form more strongly doped p-type zones 17 and 18 in the region of the memory to be formed, from which zones the p-type zones 11 and 12 around the source and drain zones will be formed in a later stage. Obviously, the implantation may alternatively be carried out before the removal of the mask 16. The boron implantation is carried out with an implantation energy of 20 keV and with a dose of $3 \times 10^{14}$ atoms per cm$^2$. It is noted that no separate mask is required for this implantation because the device is masked outside the memory portion by the layers 14 and 15. FIG. 5 shows the device in this stage of the process.

Figure 6A:
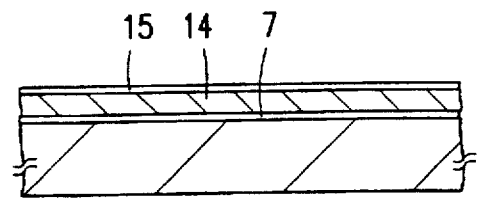
Figure 6B:
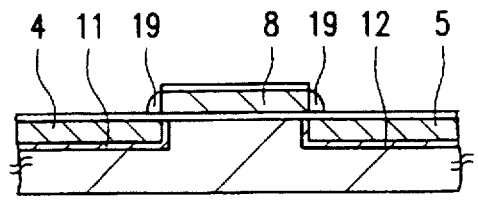

The flanks of the floating gate 8 are oxidized in a thermal oxidation step for obtaining the oxide spacers 19, see FIG. 6. During the oxidation, the upper side of the floating gate 8 and of the poly layer 14 in the logic portion are masked by the layer 15. Then the n-type source and drain zones 4 and 5 are provided in the memory portion by implantation. To this end, for example, As ions are used with an implantation energy of 60 KeV and a dose of $4 \times 10^{15}$ atoms per cm$^2$. Owing to diffusion, the edge of the source and drain zones coincides practically with the edge of the floating gate, while the non-redoped portions of the p-type zones provided before growing of the spacers 19 form the more strongly doped p-type zones 11 and 12 which extend into the channel below the floating gate 8. The logic portion of the integrated circuit is masked by the layers 14 and 15 during the As implantation.

Figure 7A:
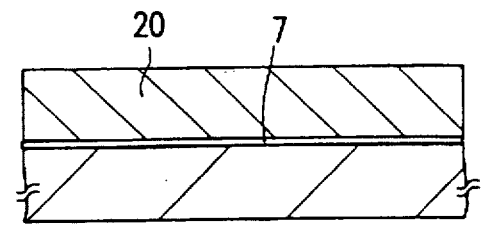
Figure 7B:
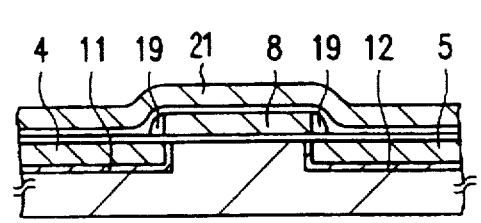

In a subsequent step, the oxynitride layer 15 is fully removed, after which an interpoly dielectric 10, consisting of oxynitride or of a composite layer of oxide-nitride-oxide, is provided by CVD. This interpoly dielectric layer 10 is removed in the logic portion by means of a photoresist mask which covers the memory and leaves the logic portion exposed. After removal of the mask, a second doped poly layer is provided with a thickness of 250 nm. In the logic portion, the second poly layer forms together with the first poly layer a coherent, 400 nm thick poly layer from which in a later stage the gates and wiring sections can be formed in the logic portion. The second poly layer 21 is insulated from the floating gate 8 by the interpoly dielectric 10 in the memory portion. FIG. 7 shows the device in this stage of the process.

Figure 8A:
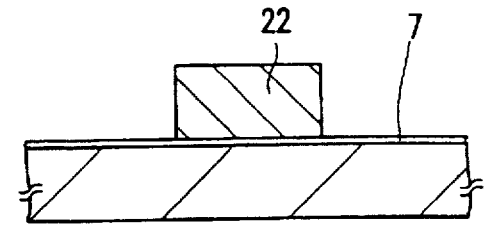
Figure 8B:
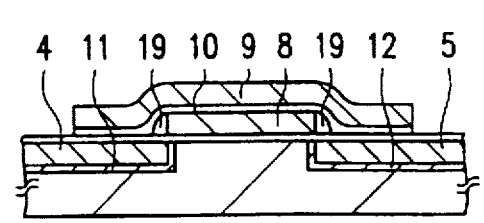

Then the gate 22 in the logic portion is formed from the poly layer 20 and the control gate 9 in the memory is formed from the poly layer 21 by means of a photoresist mask and etching. The stage shown in FIG. 8 is now obtained. The device may then be subjected to further usual process steps for the manufacture of a normal CMOS circuit so as to complete the logic portion of the circuit and to provide the interconnection in the logic portion and in the memory portion.

Figure 9:
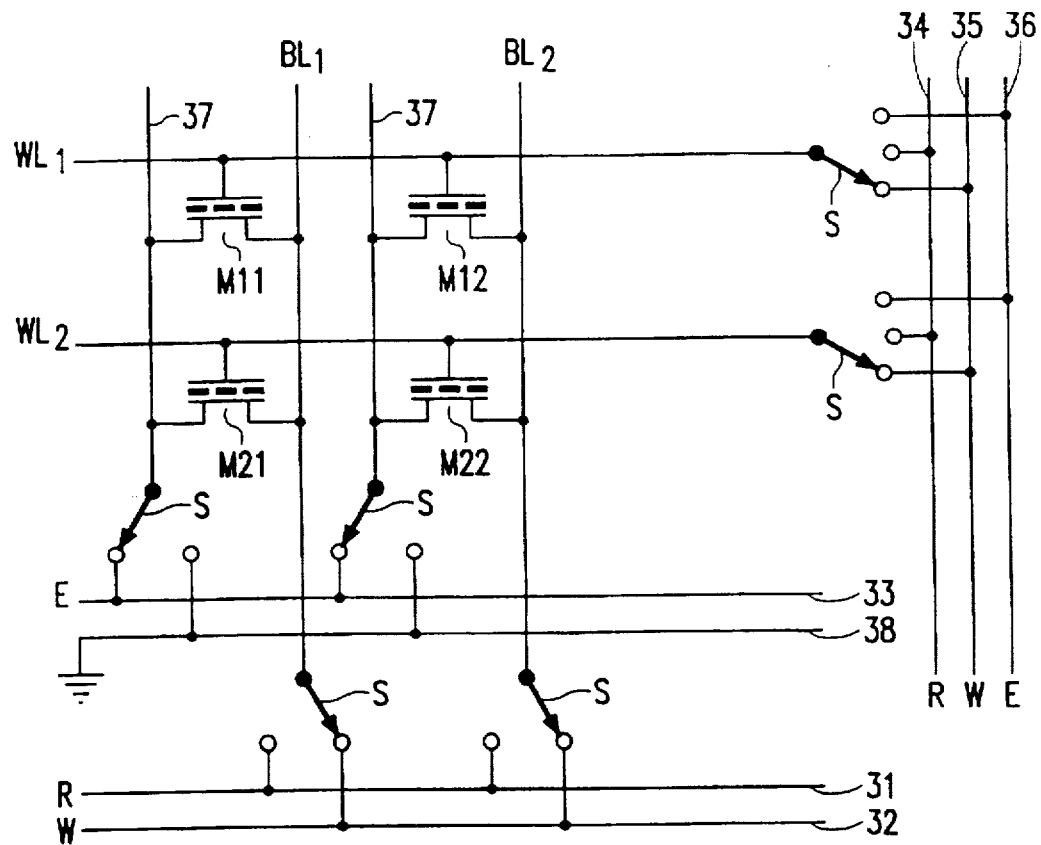
FIG. 9 shows a second embodiment of a non-volatile memory according to the invention.

In the embodiment described here, the hot holes are formed by avalanche breakdown of the pn junction of the drain zone. It may be advantageous, inter alia for preventing injection of holes into the gate oxide at the drain side of the channel, to use the pn junction of the source zone for the generation of hot holes. This is depicted in the diagram of FIG. 9, which differs from the diagram of FIG. 1 essentially in that the erase line 33 cannot be connected to the bit lines, but to the source zones of the memory elements through the lines 37. Reading and writing may be effected in an identical manner as in FIG. 1, the lines 37 being connected to the earth line 38 through switches S. The bit lines may be set for floating potential during erasing.

It will be obvious that the invention is not limited to the embodiments given here, but that many more variations are possible to those skilled in the art. Thus the memory elements may alternatively be given a so-called stacked gate configuration, in which the floating gate is defined after the control gate, at least in the direction from source to drain zone, so that in this device the floating gate and the control gate have at least substantially the same surface area, while in subsequent doping steps the p-type zones 11 and 12 and the n-type zones 4 and 5 are formed.

We claim:

1. A semiconductor device with a semiconductor body which is provided at a surface with a non-volatile electrically erasable memory comprising a plurality of memory elements each with n-type source and drain zones situated in a p-type surface region of the semiconductor body, adjoining the surface, and mutually separated by an interposed channel region, a floating gate situated above the channel region and insulated therefrom by an interposed gate dielectric, and a control gate insulated from the floating gate, information being written and erased through injection of hot electrons and hot holes into the floating gate, while the hot electrons are generated in the channel adjacent the drain zone through induction of a channel current between the source zone and drain zone, characterized in that: the source zone and the drain zone for each respective memory element within the semiconductor body are surrounded by a p-type zone of a higher doping concentration than the p-type surface region, the p-type zone of higher doping concentration forming a pn-junction with each of the source and drain zones, the hot holes are generated through avalanche breakdown of one of the pn-junctions between the n-type source or drain zone and the p-type surface region by reverse biasing said one pn junction by applying a negative voltage to said control gate, the doping concentration of the p-type surface region having a level such that breakdown voltage of said pn-junction is at most about 6V, and the gate dielectric has a substantially constant thickness;

said erasable memory being free of transistors each for a respective memory element for controlling the operation of the respective memory element.

2. A semiconductor device as claimed in claim 1, characterized in that the gate dielectric has a thickness over its entire surface such that injection of charge carriers into the floating gate caused by the tunnelling effect is completely or at least substantially completely prevented at the applied voltages.

3. A semiconductor device as claimed in claim 2, characterized in that the gate dielectric comprises a silicon oxide layer with a thickness of at least 10 nm.

4. A semiconductor device as claimed in claim 3, characterized in that the thickness of the gate dielectric is approximately 15 nm.

5. A semiconductor device as claimed in claim 1, characterized in that the memory is of the Flash-EEPROM type.

6. A semiconductor device as claimed in claim 1, characterized in that the memory is embedded into an integrated signal processing circuit.

7. A semiconductor device with memory and transistor elements, said device comprising:

a semiconductor body having a p-type surface region; and a FLASH EEPROM memory region and a field effect transistor integral with said semiconductor body, said at least one field effect transistor being located at an area of said semiconductor body not occupied by said FLASH EEPROM memory region;

said FLASH EEPROM memory region including a plurality of memory elements each including an n-type source zone and an n-type drain zone in said surface region, a channel region separating said source zone and said drain zone, a floating gate adjacent the channel region, a gate dielectric between the floating gate and the channel region, a control gate insulated from the floating gate, and a p-type zone of higher doping concentration than the p-type surface region surrounding each of said source and drain zones and forming a pn junction with each of said source and drain zones, said FLASH EEPROM memory region being free of transistors each corresponding to a respective memory element for controlling operation of the respective memory element, said at least one field effect transistor located outside of said memory region including a source zone and a drain zone in said surface region, a channel region between said source zone and said drain zone, a gate electrode, and a gate dielectric separating said gate electrode from said channel region, said gate dielectrics of said field effect transistor and said at least one memory element being comprised by a layer on said surface region having at least substantially the same thickness and composition at each of said gate dielectrics, said thickness of each said gate dielectric being at least 10 nm and being substantially constant across each said gate dielectric, and the doping concentration of said p-type zones of higher doping concentration of said memory element having a level such that the breakdown voltage of said pn junction is at most about 6V, whereby writing and erasing of said memory element are capable of being carried out through generation and migration of hot charge carriers and hot holes, respectively, to said floating gate electrode, without tunneling of electrons through said gate dielectric of said memory element, said FLASH EEPROM memory region being free of transistors each corresponding to a respective memory element for controlling operation of the respective memory element.

8. A semiconductor device as claimed in claim 7, characterized in that the thickness of the gate dielectric is approximately 15 nm.

9. A method of operating a semiconductor device having a memory region memory region with a plurality of FLASH EEPROM memory elements and a signal processing circuit with a plurality of CMOS field effect transistors, said semiconductor device including a semiconductor body having a p-type surface region; and a plurality of said FLASH EEPROM memory elements and a plurality of said field effect transistors integral with said semiconductor body, said memory region being free of transistors each respectively corresponding to the memory elements for controlling operation and operation of the respective memory element, said field effect transistors being located at an area of said semiconductor body outside of said memory region and not occupied by said memory elements;

said memory elements each including an n-type source zone and an n-type drain zone in said surface region, a channel region separating said source zone and said drain zone, a floating gate adjacent the channel region, a gate dielectric between the floating gate and the channel region, and a control gate insulated from the floating gate, and said field effect transistors each including a source zone and a drain zone in said surface region, a channel region between said source zone and said drain zone, a gate electrode, and a gate dielectric separating said gate electrode from said channel region, said method comprising the steps of:

providing a p-type zone of higher doping concentration than the p-type surface region adjacent each of said source and drain zones, thereby forming a pn junction between each of said source and drain zones and the respective p-type zone of higher doping concentration, the doping concentration of said p-type zones of higher doping concentration of said memory element having a level such that the breakdown voltage of said pn junction is at most about 6V;

providing a layer of material on said surface region which forms the respective gate dielectrics of each of said memory elements and said field effect transistors, said layer of material having at least substantially the same thickness and composition at each of said gate dielectrics, said thickness of each gate dielectric being at least 10 nm and being substantially constant across each gate dielectric;

writing to each said memory element by causing generation of hot charge carriers at the pn-junction of one of (i) said source zone and (ii) said drain zone and migration of the hot charge carriers across said gate dielectric, substantially without tunneling, to store a charge on said floating gate electrode; and erasing each said memory element by causing generation of hot holes by avalanche breakdown at the pn-junction of one of (i) said source zone and (ii) said drain zone and migration of said hot holes across said gate dielectric to compensate the charge stored on said floating gate electrode during writing, by reverse biasing said one pn junction by applying a negative voltage to said control gate;

said erasing and writing steps being conducted with voltages applied to memory elements which have magnitudes substantially no greater than that applied to said field effect transistors.

10. A method according to claim 9, wherein said generation of hot charge carriers for writing is at said drain zone and said generation of hot holes for erasing is at said source zone.

* * * * *